United States Patent
Hsu et al.

(10) Patent No.: US 10,103,287 B2
(45) Date of Patent: Oct. 16, 2018

(54) SEMICONDUCTOR ARRANGEMENT AND FORMATION THEREOF

(71) Applicant: Taiwan Semiconductor Manufacturing Company Limited, Hsin-Chu (TW)

(72) Inventors: Kai-Chun Hsu, Yonghe (TW); Shyh-Fann Ting, Tainan (TW); Jhy-Jyi Sze, Hsin-Chu (TW); Chun-Tsung Kuo, Tainan (TW); Ching-Chun Wang, Tainan (TW); Dun-Nian Yaung, Taipei (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 66 days.

(21) Appl. No.: 14/149,016

(22) Filed: Jan. 7, 2014

(65) Prior Publication Data
US 2015/0155326 A1  Jun. 4, 2015

Related U.S. Application Data

(60) Provisional application No. 61/910,161, filed on Nov. 29, 2013.

(51) Int. Cl.
*H01L 27/146* (2006.01)
*H01L 31/18* (2006.01)

(52) U.S. Cl.
CPC .......... *H01L 31/18* (2013.01); *H01L 27/1461* (2013.01); *H01L 27/14614* (2013.01); *H01L 27/14689* (2013.01)

(58) Field of Classification Search
CPC ............. H01L 27/146; H01L 27/14612; H01L 27/14614
See application file for complete search history.

(56) References Cited

U.S. PATENT DOCUMENTS

| | | | |
|---|---|---|---|
| 6,534,356 B1 * | 3/2003 | Yang et al. | 438/234 |
| 2004/0089883 A1 * | 5/2004 | Kim | H01L 27/14689 257/222 |
| 2004/0164331 A1 * | 8/2004 | Hung | H01L 27/14609 257/292 |
| 2005/0051701 A1 * | 3/2005 | Hong | H01L 27/14609 250/214.1 |
| 2006/0121640 A1 * | 6/2006 | Kim | H01L 27/14609 438/57 |
| 2006/0157761 A1 * | 7/2006 | Park | H01L 27/14609 257/293 |

(Continued)

*Primary Examiner* — Jae Lee
(74) *Attorney, Agent, or Firm* — Cooper Legal Group, LLC

(57) ABSTRACT

A semiconductor arrangement and method of formation are provided herein. A semiconductor arrangement includes an active area on a substrate, where the active area is at least one of a p-type region or an n-type region. The substrate includes a well, where the well is a p-well when the active area is a p-type region, and the well is an n-well when the active area is an n-type region. The well includes a photodiode. The active area is connected to a voltage supply having a voltage level, such as ground. The active area on the substrate increases a distance between the photodiode and the active area, which reduces junction leakage as compared to a semiconductor arrangement where the active area is formed at least partially within the substrate.

14 Claims, 11 Drawing Sheets

(56) References Cited

U.S. PATENT DOCUMENTS

2007/0007611 A1* 1/2007 Park et al. .................... 257/431
2012/0085888 A1* 4/2012 Endo ................. H01L 27/14609
                 250/208.1

* cited by examiner

SEMICONDUCTOR ARRANGEMENT AND FORMATION THEREOF

BACKGROUND

A semiconductor arrangement comprises one or more semiconductor devices. An image sensor is a type of semiconductor device that converts an optical input into an electrical signal. The image sensor comprises an array of light detecting elements, such as photodiodes, where a light detecting element is configured to produce an electrical signal corresponding to an intensity of light impinging on the light detecting element. The electrical signal is used, in some instances, to display an image corresponding to the optical input.

DESCRIPTION OF THE DRAWINGS

Aspects of the disclosure are understood from the following detailed description when read with the accompanying drawings. It will be appreciated that elements and/or structures of the drawings are not necessarily drawn to scale. Accordingly, the dimensions of the various features may be arbitrarily increased and/or reduced for clarity of discussion.

DETAILED DESCRIPTION

Figure 1:
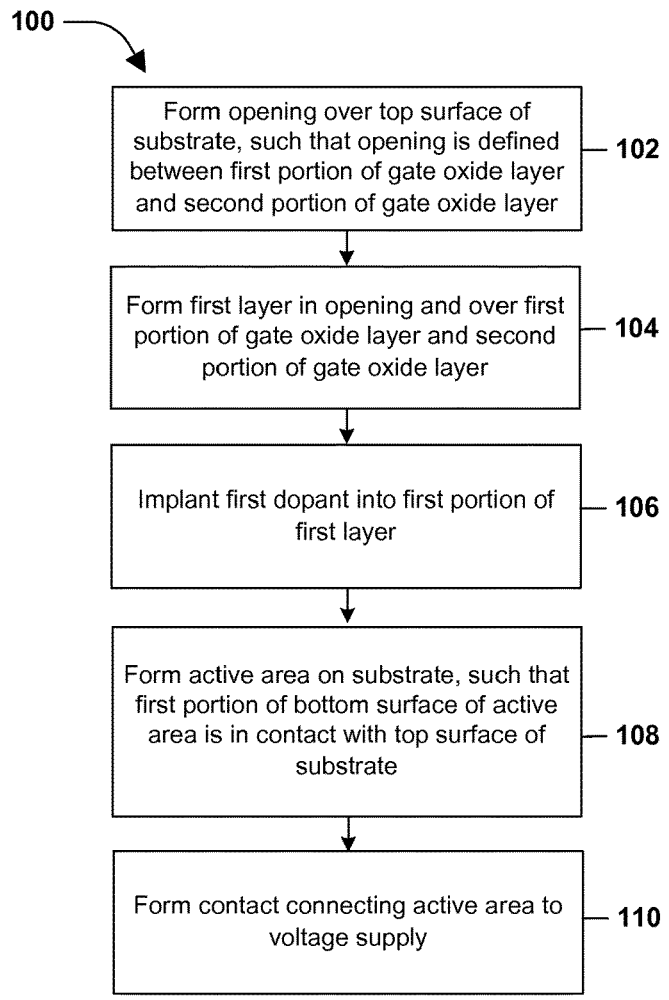
FIG. 1 is a flow diagram illustrating a method of forming a semiconductor arrangement, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor arrangement and resulting structures formed thereby are provided herein.

Figure 7:
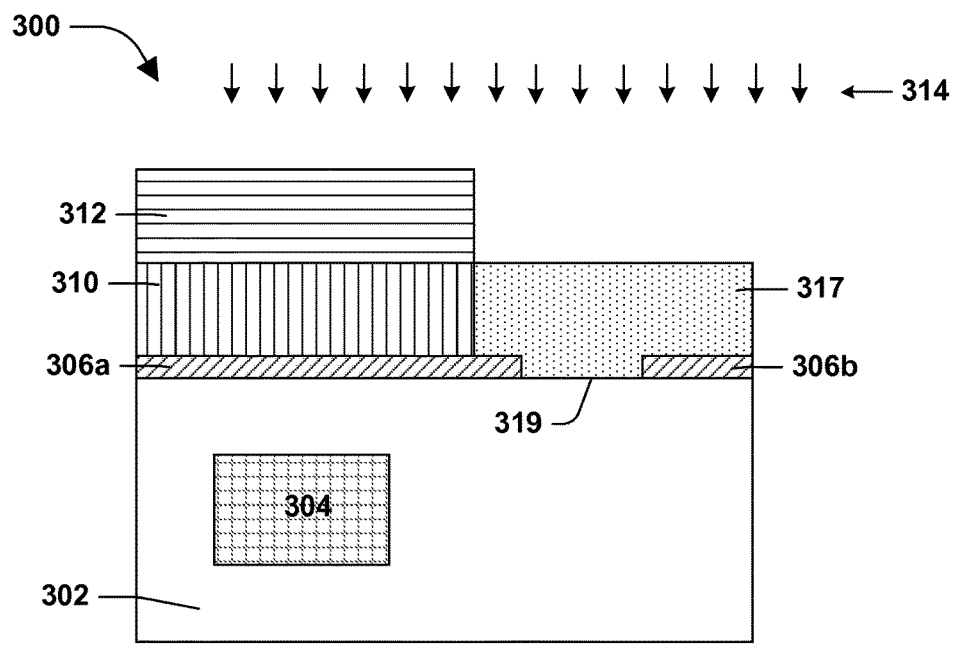
FIG. 7 is an illustration of a semiconductor arrangement, according to some embodiments.
Figure 8:
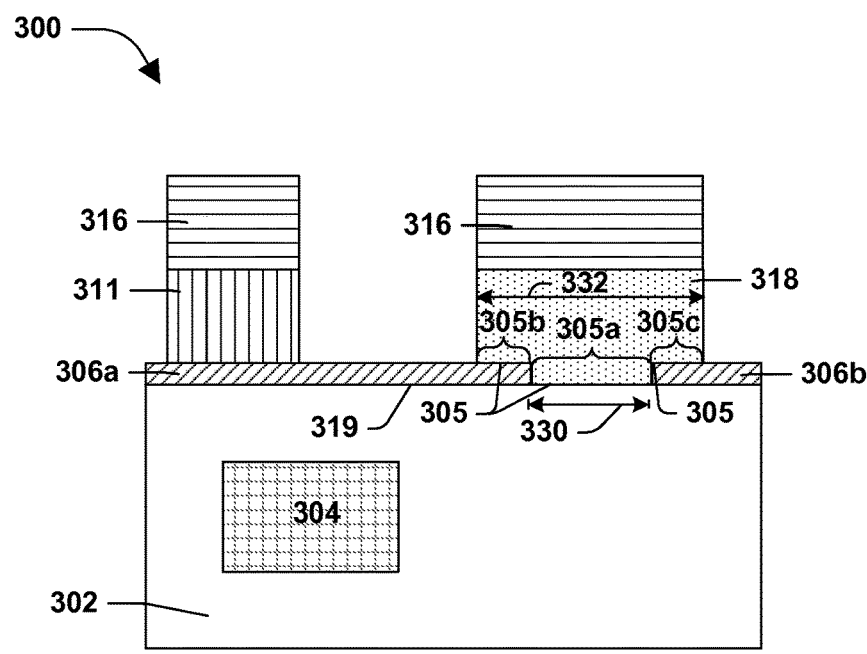
FIG. 8 is an illustration of a semiconductor arrangement, according to some embodiments.
Figure 9:
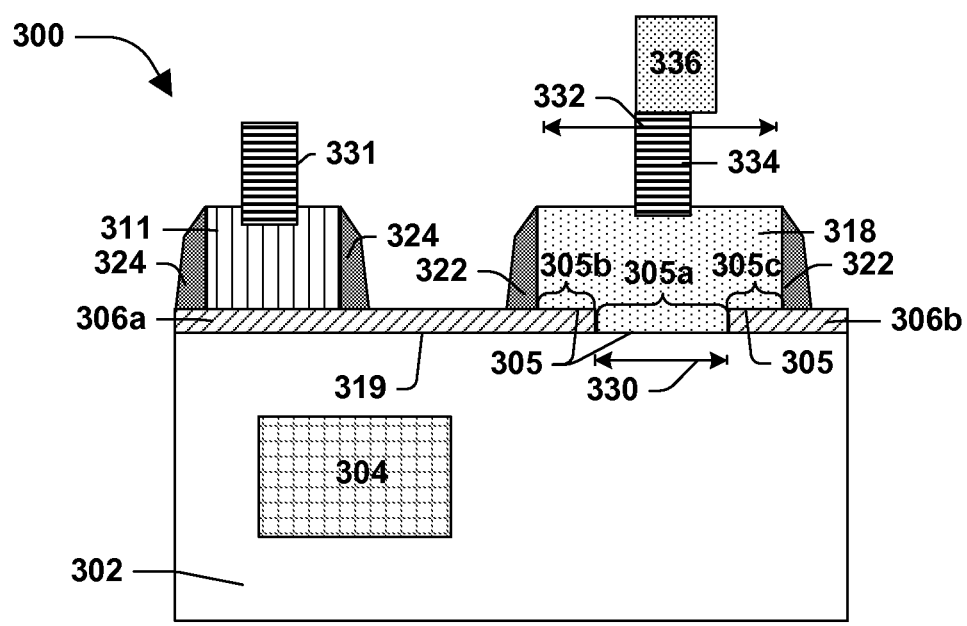
FIG. 9 is an illustration of a semiconductor arrangement, according to some embodiments.

A first method 100 of forming a semiconductor arrangement 300 according to some embodiments is illustrated in FIG. 1 and one or more structures formed thereby at various stages of fabrication are illustrated in FIGS. 3-9. According to some embodiments, a semiconductor arrangement 300 comprises an active area 318 comprising at least one of an n-type region or a p-type region disposed on a substrate 302, as illustrated in FIG. 9. In some embodiments, the substrate 302 comprises a well. In some embodiments, the well comprises a photodiode 304, or rather a photodiode is formed in the well. In some embodiments, a first portion 305a of a bottom surface 305 of the active area 318 is in contact with a top surface 319 of the substrate 302. In some embodiments, the active area 318 is connected to a voltage supply 336, such as through a contact 334, so that the active area 318 connects the substrate 302, and thus the photodiode 304, to a voltage level corresponding to the voltage supply 336. In some embodiments, the voltage level is ground or zero volts.

Figure 3:
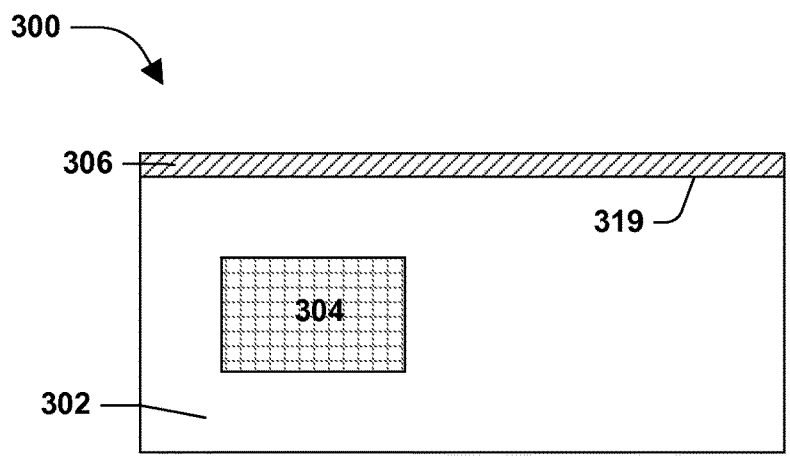
FIG. 3 is an illustration of a semiconductor arrangement, according to some embodiments.
Figure 4:
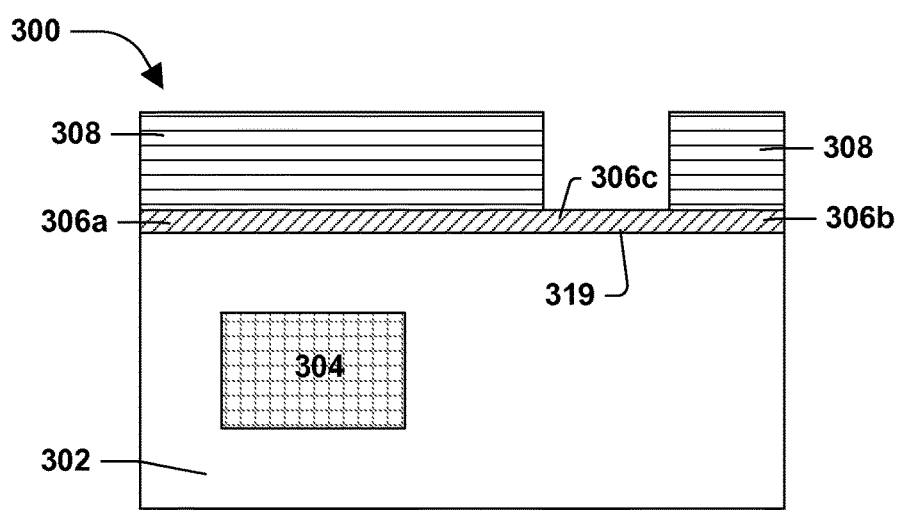
FIG. 4 is an illustration of a semiconductor arrangement, according to some embodiments.
Figure 5:
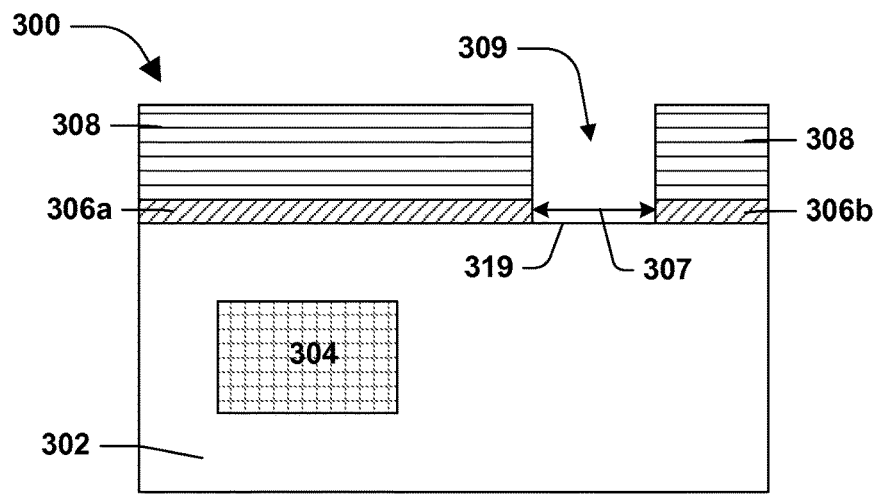
FIG. 5 is an illustration of a semiconductor arrangement, according to some embodiments.

At 102, an opening 309 is formed over a top surface 319 of a substrate 302, such that the opening 309 is defined between a first portion 306a of a gate oxide layer 306 and a second portion 306b of the gate oxide layer 306, as illustrated in FIG. 5, according to some embodiments. Prior to FIG. 5, as illustrated in FIG. 3, a photodiode 304 is in the well in the substrate 302, and the gate oxide layer 306 is over the top surface 319 of the substrate 302, according to some embodiments. In some embodiments, the well is at least one of an n-well or a p-well. In some embodiments, the substrate 302 comprises silicon. In some embodiments, the substrate 302 comprises an n-type dopant, such as phosphorus, or a p-type dopant, such as boron. According to some embodiments, the substrate 302 comprises at least one of an epitaxial layer, a silicon-on-insulator (SOI) structure, a wafer, or a die formed from a wafer. In some embodiments, the photodiode 304 comprises at least one of an n-type photodiode or a p-type photodiode. In some embodiments, the gate oxide layer 306 comprises a high dielectric material, such as oxide. In some embodiments, the gate oxide layer 306 has a thickness between about 50 Å to about 90 Å. In some embodiments, the gate oxide layer 306 is formed by deposition with a furnace. In some embodiments, a first mask 308 is formed over the gate oxide layer 306 and is patterned such that the first mask 308 is over a first portion 306a of the gate oxide layer 306 and a second portion 306b of the gate oxide layer 306 but exposes a third portion 306c of the gate oxide layer 306, as illustrated in FIG. 4. Turning to FIG. 5, the opening 309 is formed such that the first portion 306a of the gate oxide layer 306 and the second portion 306b of the gate oxide layer 306 bound or define the opening 309, according to some embodiments. The opening 309 exposes the top surface 319 of the substrate 302 between the first portion 306a of the gate oxide layer 306 and the second portion 306b of the gate oxide layer 306, according to some embodiments. In some embodiments, the opening 309 has a width 307. In some embodiments, the opening 309 is formed by etching, such as etching with hydrogen fluoride (HF). In some embodiments, the first mask 308 is removed after the opening 309 is formed.

Figure 6:
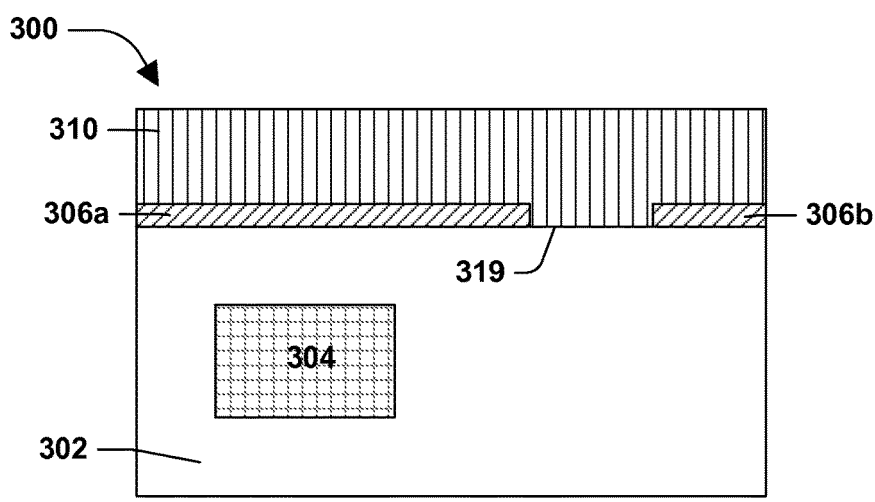
FIG. 6 is an illustration of a semiconductor arrangement, according to some embodiments.

At 104, a first layer 310 is formed in the opening 309 and over the first portion 306a of the gate oxide layer 306 and the second portion 306b of the gate oxide layer 306, as illustrated in FIG. 6, according to some embodiments. In some embodiments, the first layer 310 comprises polysilicon. In some embodiments, the first layer 310 is formed by at least one of atomic layer deposition (ALD), physical vapor deposition (PVD) or chemical vapor deposition (CVD). In some embodiments, the first layer 310 has a thickness between about 1,000 Å to about 2,000 Å.

At 106, a first implantation 314 is performed to implant a first dopant into a first portion of the first layer 310 to form a first implanted area 317, as illustrated in FIG. 7, according to some embodiments. In some embodiments, a second mask 312 is formed over the first layer 310 and is patterned to expose the first portion of the first layer 310, which is over the opening 309. In some embodiments, the first dopant is one of an n-type dopant, such as phosphorus, or a p-type dopant, such as boron. In some embodiments, the first dopant is implanted at a dose of about $0.5\ e^{15}$ atoms/cm$^2$ to about $1.5\ e^{15}$ atoms/cm$^2$ and at an energy of between about 4 keV to about 15 keV. In some embodiments, the first implanted area 317 is in contact with the top surface 319 of the substrate 302. In some embodiments, the second mask 312 is removed after the first implanted area 317 is formed.

At 108, the first active area 318 is formed on the substrate 302, such that the first portion 305a of the bottom surface 305 of the active area 318 is in contact with the top surface 319 of the substrate 302, as illustrated in FIG. 8. In some embodiments, the first portion 305a of the bottom surface 305 of the active area 318 is in contact with the well in the substrate 302. A third mask 316 is formed and patterned and is used to pattern the first implanted area 317 and a gate portion of the first layer 310, according to some embodiments. In some embodiments, a gate 311 is formed, such as by etching away portions of the first layer 310 not under the third mask 316. In some embodiments, the gate 311 comprises materials of the first layer 310. In some embodiments, the active area 318 is formed such that the first portion 305a of the active area 318 has a first length 330, and such that a top surface of the active area 318 has a second length 332, the first length 330 less than the second length 332. In some embodiments, the width 307, illustrated in FIG. 5, is substantially equal to the first length 330. In some embodiments, the gate oxide layer 306 functions as an etch stop layer when etching the first implanted area 317 and etching the first layer 310 to form the gate 311 such that little to none of the substrate 302 is etched. In some embodiments, the second portion 305b of the bottom surface 305 of the active area 318 is in contact with the first portion 306a of the gate oxide layer 306. In some embodiments, the third portion 305c of the bottom surface 305 of the active area 318 is in contact with the second portion 306b of the gate oxide layer 306. In some embodiments, the active area 318 comprises an active area dopant concentration. In some embodiments, the well comprises a well dopant concentration, the well dopant concentration less than the active area dopant concentration. In some embodiments, the active area 318 comprises at least one of an n-type region or a p-type region. In some embodiments, the active area 318 comprises an n-type region when the well comprises an n-well. In some embodiments, the active area 318 comprises a p-type region when the well comprises a p-well. In some embodiments, the third mask 316 is removed after etching the first implanted area 317 and etching the first layer 310 to form the gate 311. In some embodiments, gate sidewalls 324 are formed adjacent the gate 311, as illustrated in FIG. 9. In some embodiments, the gate sidewalls 324 comprise at least one of oxide or nitride. In some embodiments, active area sidewalls 322 are formed adjacent the active area 318. In some embodiments, the active area sidewalls 322 comprise at least one of oxide or nitride.

At 110, a contact 334 is formed, such that the contact 334 connects the active area 318 to a voltage supply 336, as illustrated in FIG. 9, according to some embodiments. In some embodiments, the contact 334 comprises a conductive material, such as metal. In some embodiments, the voltage supply 336 comprises ground. In some embodiments, a gate contact 331 is formed over the gate 311. In some embodiments, the gate contact 331 comprises a conductive material, such as metal. In some embodiments, the active area 318 on the substrate 302 increases a distance between the photodiode 304 and the active area 318 as compared to a semiconductor arrangement where an active area is formed at least partially within a substrate to couple at least one of the substrate, a well formed in the substrate, or a photodiode in the substrate to a voltage supply, such as ground. In some embodiments, the increased distance between the photodiode and the active area 318 reduces junction leakage. In some embodiments, the semiconductor arrangement 300 comprises an increased full well capacity (FWC) as compared to a semiconductor arrangement where an active area is formed at least partially within a substrate comprising a photodiode. In some embodiments, the semiconductor arrangement 300 comprises decreased lattice damage in the substrate 302 as compared to a semiconductor arrangement where an active area is formed at least partially within a substrate comprising a photodiode.

Figure 2:
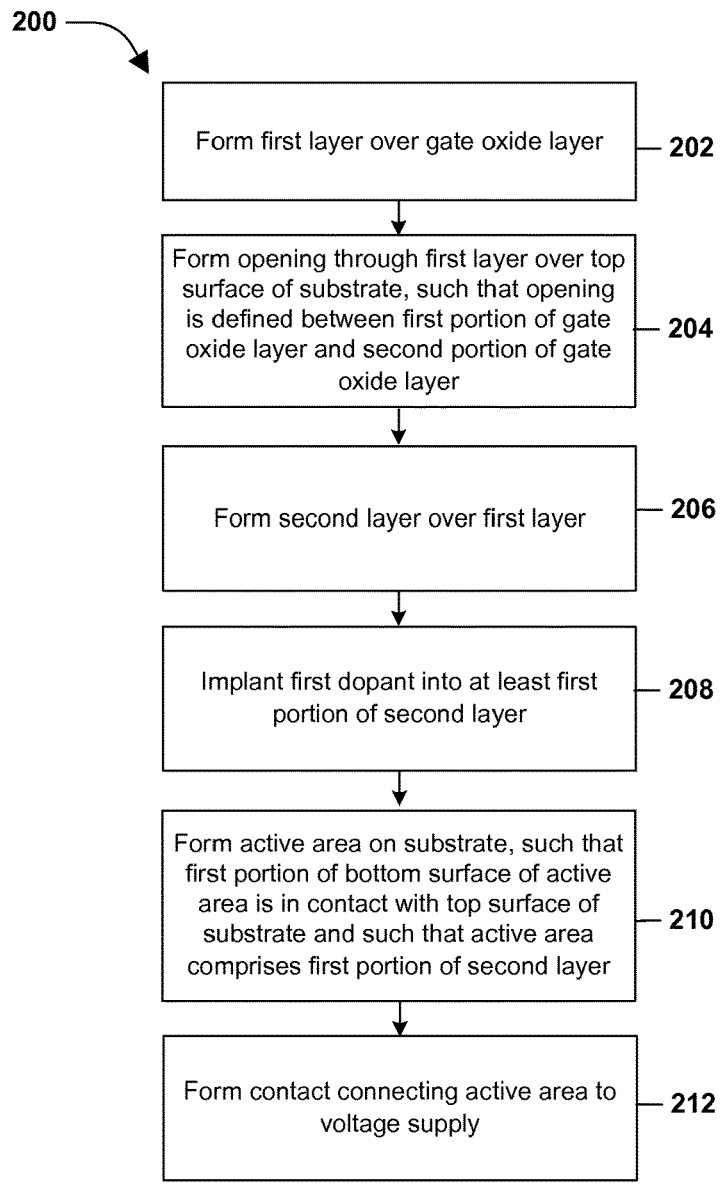
FIG. 2 is a flow diagram illustrating a method of forming a semiconductor arrangement, according to some embodiments.
Figure 13:
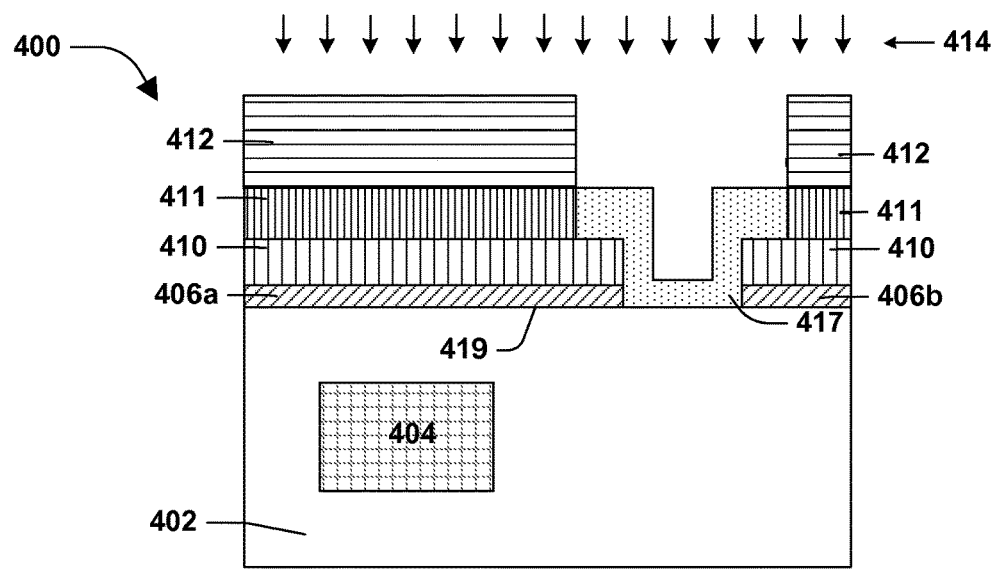
FIG. 13 is an illustration of a semiconductor arrangement, according to some embodiments.
Figure 14:
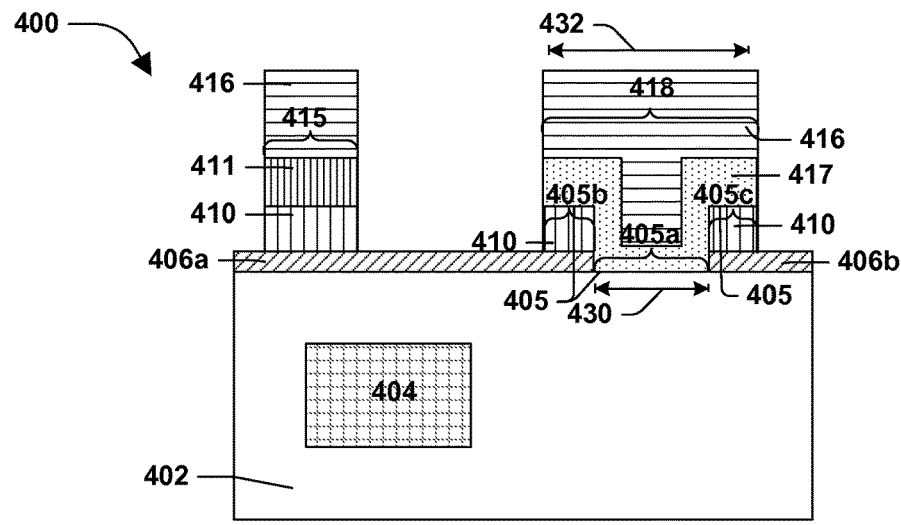
FIG. 14 is an illustration of a semiconductor arrangement, according to some embodiments.
Figure 15:
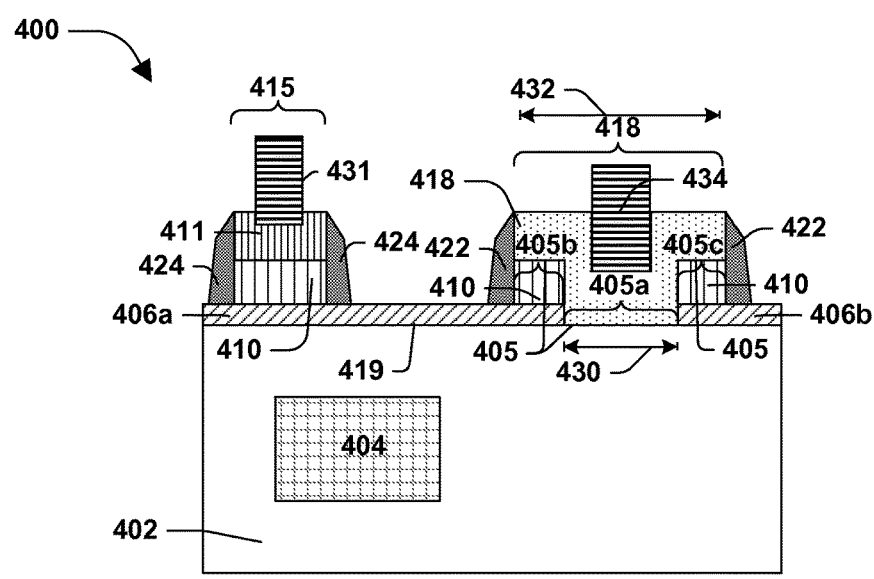
FIG. 15 is an illustration of a semiconductor arrangement, according to some embodiments.
Figure 16:
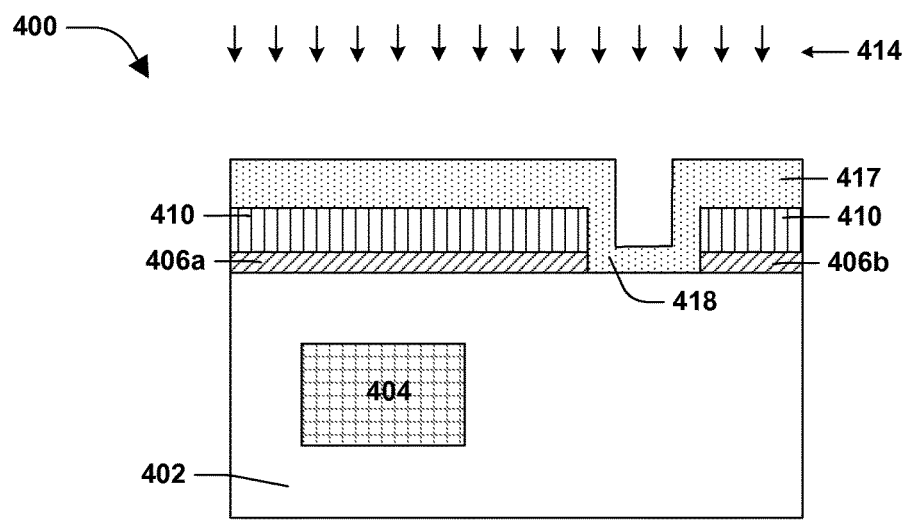
FIG. 16 is an illustration of a semiconductor arrangement, according to some embodiments.
Figure 17:
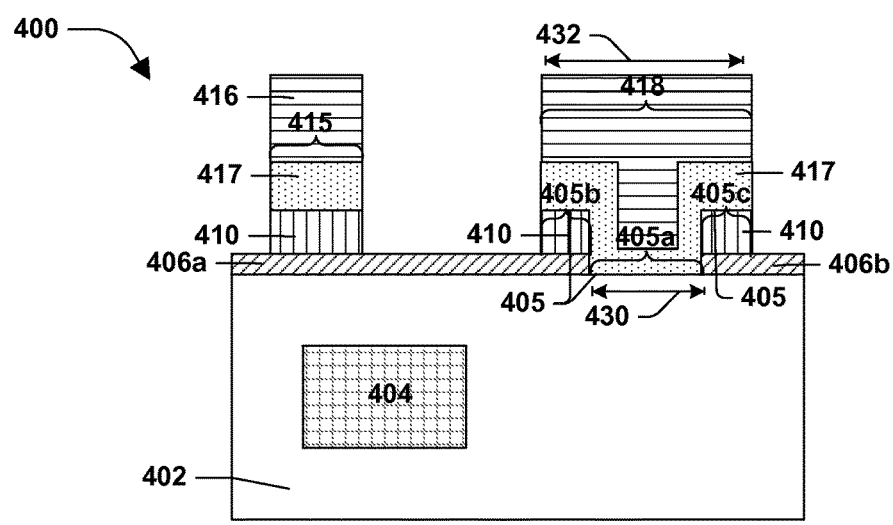
FIG. 17 is an illustration of a semiconductor arrangement, according to some embodiments.
Figure 18:
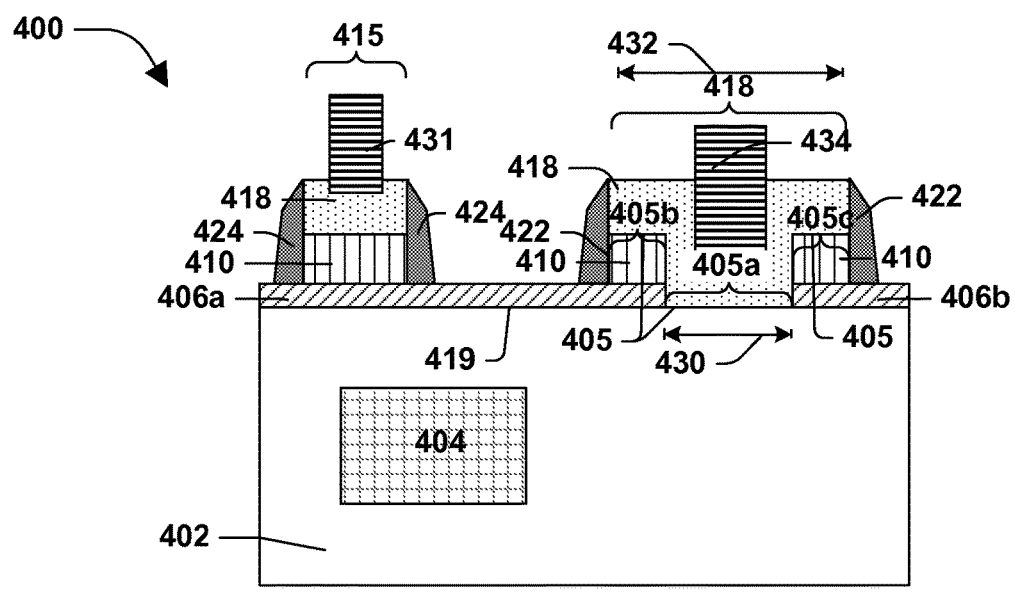
FIG. 18 is an illustration of a semiconductor arrangement, according to some embodiments.

A second method 200 of forming a semiconductor arrangement 400 according to some embodiments is illustrated in FIG. 2 and one or more structures formed thereby at various stages of fabrication are illustrated in FIGS. 10-18. According to some embodiments, a semiconductor arrangement 400 comprises an active area 418 comprising at least one of an n-type region or an n-type region disposed on a substrate 402, as illustrated in FIGS. 15 and 18. In some embodiments, the substrate 402 comprises a well. In some embodiments, the well comprises a photodiode 404, or rather a photodiode is formed in the well. In some embodiments, a first portion 405a of a bottom surface 405 of the active area 418 is in contact with a top surface 419 of the substrate 402. In some embodiments, the active area 418 is connected to a voltage supply (not shown), such as through a contact 434, so that the active area 418 connects the substrate 402, and thus the photodiode 404, to a voltage level corresponding to the voltage supply. In some embodiments, the voltage level is ground or zero volts.

Figure 10:
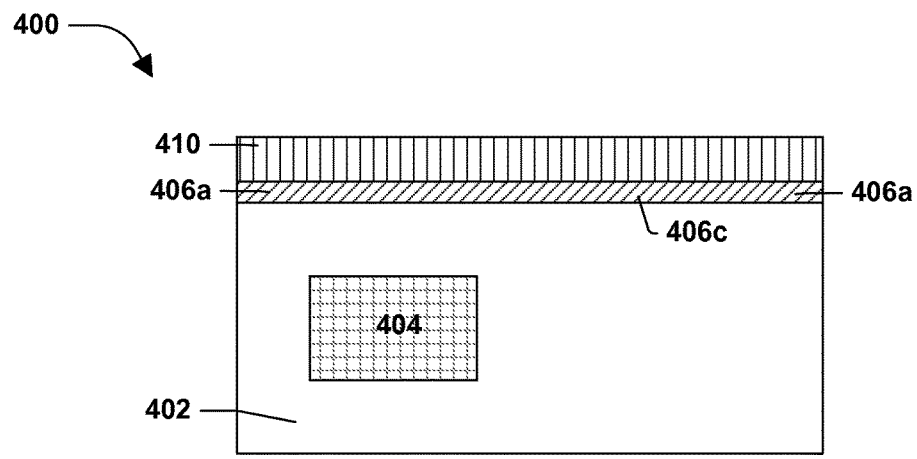
FIG. 10 is an illustration of a semiconductor arrangement, according to some embodiments.

At 202, a first layer 410 is formed over a gate oxide layer 406, as illustrated in FIG. 10. In some embodiments, the gate oxide layer 406 is formed over a substrate 402. In some embodiments, a photodiode 404 is in the well in the substrate 402, and the gate oxide layer 406 is over the top surface 419 of the substrate 402, according to some embodiments. In some embodiments, the substrate 402, the photodiode 404 and the gate oxide layer 406 are formed as described above with regards to the substrate 302, the photodiode 304 and the gate oxide layer 306, as illustrated in FIG. 3. In some embodiments, the first layer 410 comprises polysilicon. In some embodiments, the first layer 410 is formed by at least one of ALD, PVD or CVD. In some embodiments, the first layer 410 has a thickness between about 500 Å to about 1,000 Å.

Figure 11:
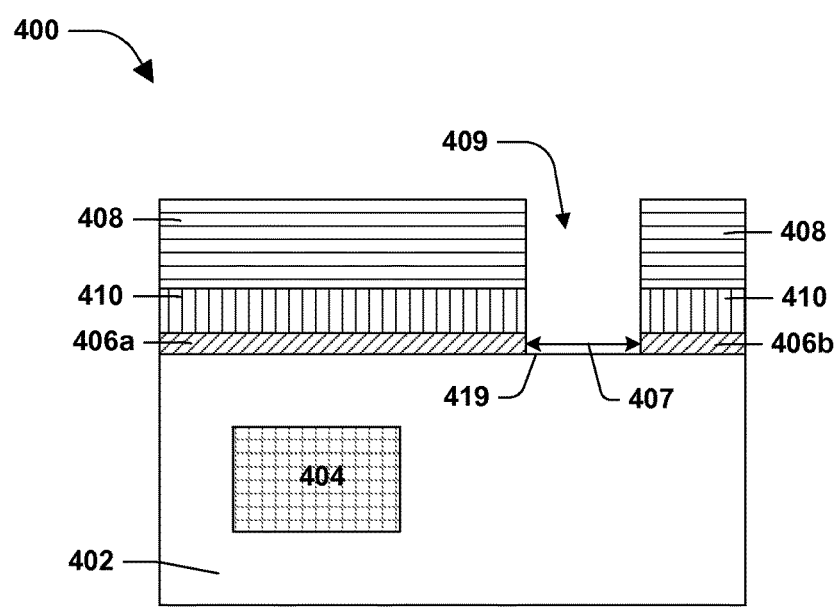
FIG. 11 is an illustration of a semiconductor arrangement, according to some embodiments.

At 204, an opening 409 is formed through the first layer 410 and the gate oxide layer 406 such that a top surface 419 of the substrate 402 is exposed, as illustrated in FIG. 11, according to some embodiments. In some embodiments, the opening 409 is formed such that the first portion 406a of the gate oxide layer 406 and the second portion 406b of the gate oxide layer 406 bound or define the opening 409, according to some embodiments. In some embodiments, the opening 409 has a width 407. In some embodiments, a first mask 408 is formed over the gate oxide layer 406 and is patterned such that the first mask 408 is over a first portion 406a of the gate oxide layer 406 and a second portion 406b of the gate oxide layer 406 but exposes a third portion 406c of the gate oxide layer 406. In some embodiments, the opening 409 is formed by etching, such as by a first etch to etch through the first layer 410 and a second etch to etch through the gate oxide layer 406, where the second etch comprises hydrogen fluoride (HF). In some embodiments, the first mask 408 is removed after the opening 409 is formed.

Figure 12:
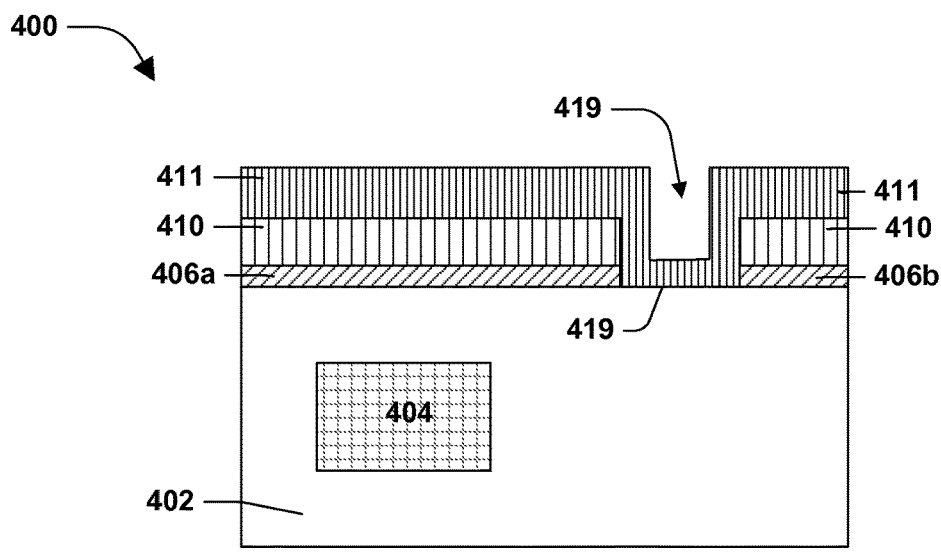
FIG. 12 is an illustration of a semiconductor arrangement, according to some embodiments.

At 206, a second layer 411 is formed over the first layer 410, as illustrated in FIG. 12. In some embodiments, the second layer 411 is formed conformally with the opening 409, such that a second layer opening 419 is formed. In some embodiments, the second layer 411 comprises polysilicon. In some embodiments, the second layer 411 is formed by at least one of ALD, PVD or CVD. In some embodiments, the second layer 411 has a thickness between about 500 Å to about 1,000 Å.

At 208, a first implantation 414 is performed to implant a first dopant into at least a first portion of the second layer 411 to form a first implanted area 417, as illustrated in FIGS. 13 and 16, according to some embodiments. In some embodiments, a second mask 412 is formed over the second layer 411 and is patterned to expose the first portion of the second layer 411, which is over the opening 409, as illustrated in FIG. 13. In some embodiments, the first dopant is one of an n-type dopant, such as phosphorus, or a p-type dopant, such as boron. In some embodiments, the first dopant is implanted at a dose of about $0.5\ e^{15}$ atoms/cm$^2$ to about $1.5\ e^{15}$ atoms/cm$^2$ at an energy of between about 4 keV to about 15 keV. In some embodiments, the first implanted area 417 is in contact with the top surface 419 of the substrate 402. In some embodiments, the second mask 312 is removed after the first implanted area 417 is formed. In some embodiments, the first implantation 414 is performed to implant a first dopant into the second layer 411 to form the first implanted area 417, where no second mask 412 is formed, as illustrated in FIG. 16. In some embodiments, the first dopant is one of an n-type dopant, such as phosphorus, or a p-type dopant, such as boron. In some embodiments, the first dopant is implanted at a dose of about $0.5\ e^{15}$ atoms/cm$^2$ to about $1.5\ e^{15}$ atoms/cm$^2$ at an energy of between about 1 keV to about 5 keV. In some embodiments, the first implanted area 417 is in contact with the top surface 419 of the substrate 402.

At 210, the active area 418 is formed on the substrate 402, such that the first portion 405a of a bottom surface 405 of the active area 418 is in contact with a top surface 419 of the substrate 402, as illustrated in FIGS. 14 and 17, according to some embodiments. In some embodiments, the first portion 405a of the bottom surface 405 of the active area 418 is in contact with the well in the substrate 402. A third mask 416 is formed and patterned and is used to pattern the first implanted area 417 and a gate portion of the second layer 411, as illustrated in FIG. 14, according to some embodiments. In some embodiments, a gate 415 is formed, such as by etching away portions of the first layer 410 and the second layer 411 not under the third mask 416, as illustrated in FIG. 14. In some embodiments, the gate 415 comprises materials of the first layer 410 and materials of the second layer 411 as illustrated in FIG. 14. In some embodiments, a gate 415 is formed, such as by etching away portions of the first layer 410 and the first implanted area 417 not under the third mask 316, as illustrated in FIG. 17. In some embodiments, the gate 415 comprises materials of the first layer 410 and materials of the first implanted area 417, as illustrated in FIG. 17. In some embodiments, the active area 418 comprises the first implanted area 417 and the first layer 410, as illustrated in FIGS. 14 and 17. In some embodiments, the active area 418 is formed such that the first portion 405a of the active area 418 has a first length 430, and such that a top surface of the active area 418 has a second length 432, the first length 430 less than the second length 432. In some embodiments, the width 307, as illustrated in FIG. 11, is substantially equal to the first length 430. In some embodiments, the gate oxide layer 406 functions as an etch stop layer when etching the first implanted area 417 and the first layer 410 to form the active area 418 and etching the first layer 410 and the second layer 411 to form the gate 415 or etching the first layer 410 and the implanted area to form the gate, such that little to none of the substrate 402 is etched. In some embodiments, the second portion 405b of the bottom surface 405 of the active area 418 is in contact with the first portion 406a of the gate oxide layer 406. In some embodiments, the third portion 405c of the bottom surface 405 of the active area 418 is in contact with the second portion 406b of the gate oxide layer 406. In some embodiments, the active area 418 comprises an active area dopant concentration. In some embodiments, the well comprises a well dopant concentration, the well dopant concentration less than the active area dopant concentration. In some embodiments, the active area 418 comprises at least one of an n-type region or a p-type region. In some embodiments, the active area 418 comprises an n-type region when the well comprises an n-well. In some embodiments, the active area 418 comprises a p-type region when the well comprises a p-well. In some embodiments, the third mask 416 is removed after etching the first layer and the first implanted area 417 to form the active area 418 and etching the first layer 410 and the second layer 411 to form the gate 415, or after etching the first layer and the first implanted area 417 to form the gate 415. In some embodiments, gate sidewalls 424 are formed adjacent the gate 415, as illustrated in FIGS. 15 and 18. In some embodiments, the gate sidewalls 424 comprise at least one of oxide or nitride. In some embodiments, active area sidewalls 422 are formed adjacent the active area 418. In some embodiments, the active area sidewalls 422 comprise at least one of oxide or nitride.

At 212, a contact 434 is formed, such that the contact 434 connects the active area 418 to a voltage supply (not shown), as illustrated in FIGS. 15 and 18, according to some embodiments. In some embodiments, the contact 434 comprises a conductive material, such as metal. In some embodiments, the voltage supply comprises ground. In some embodiments, a gate contact 431 is formed over the gate 415. In some embodiments, the gate contact 431 comprises a conductive material, such as metal. In some embodiments, the active area 418 on the substrate 402 increases a distance between the photodiode 404 and the active area 404 as compared to a semiconductor arrangement where an active area is formed at least partially within a substrate to couple at least one of the substrate, a well formed in the substrate, or a photodiode in the substrate to a voltage supply, such as ground. In some embodiments, the increased distance between the photodiode 404 and the active area 418 reduces junction leakage. In some embodiments, the semiconductor arrangement 400 comprises an increased full well capacity (FWC) as compared to a semiconductor arrangement where an active area is formed at least partially within a substrate comprising a photodiode. In some embodiments, the semiconductor arrangement 400 comprises decreased lattice damage in the substrate 402 as compared to a semiconductor arrangement where an active area is formed at least partially within a substrate comprising a photodiode.

According to some embodiments, a semiconductor arrangement comprises an active area comprising at least one of a p-type region or an n-type region, the active area disposed on a substrate comprising a well. In some embodiments, a first portion of a bottom surface of the active area is in contact with a top surface of the substrate such that the active area is in contact with the well. In some embodiments, a contact connects the active area to a voltage supply.

According to some embodiments, a method of forming a semiconductor arrangement comprises forming an opening over a top surface of a substrate, forming an active area on the substrate and forming a contact connecting the active area to a voltage supply. In some embodiments, the substrate comprises a well, such that the opening is defined between a first portion of a gate oxide layer and a second portion of a gate oxide layer. In some embodiments, the active area is formed on the substrate, such that a first portion of a bottom surface of the active area is in contact with the top surface of the substrate.

According to some embodiments, a semiconductor arrangement comprises an active area comprising a p-type region. In some embodiments, the active area is disposed on a substrate comprising a well, the well comprising a photodiode. In some embodiments, a first portion of a bottom surface of the active area is in contact with a top surface of the substrate such that the active area is on contact with the well. In some embodiments, a contact connects the active area to a voltage supply.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement, comprising:
    a photodiode within a substrate;
    an active area comprising at least one of a p-type region or an n-type region, wherein:
        a first portion of a bottom surface of the active area is in contact with a top surface of the substrate,
        a second portion of the bottom surface of the active area is spaced apart from the top surface of the substrate,
        none of the active area vertically overlaps the photodiode, and
        the substrate surrounds the photodiode such that the substrate is in contact with a top surface and a bottom surface of the photodiode; and
    a gate overlying the photodiode.

2. The semiconductor arrangement of claim 1, comprising a contact in contact with and penetrating through a top surface of the active area.

3. The semiconductor arrangement of claim 1, the active area comprising doped polysilicon.

4. The semiconductor arrangement of claim 1, comprising:

a gate oxide layer disposed between the second portion of the bottom surface of the active area and the top surface of the substrate; and a sidewall spacer adjacent the active area, the gate oxide layer further disposed between the substrate and the sidewall spacer.

5. The semiconductor arrangement of claim 1, the substrate comprising a well, the photodiode embedded in the well such that the well is in contact with the top surface and the bottom surface of the photodiode, the active area comprising an active area dopant concentration and the well comprising a well dopant concentration, the active area dopant concentration greater than the well dopant concentration.

6. The semiconductor arrangement of claim 1, the second portion of the bottom surface of the active area over a first portion of a gate oxide layer and a third portion of the bottom surface of the active area over a second portion of the gate oxide layer.

7. The semiconductor arrangement of claim 6, the first portion of the gate oxide layer spaced apart from the second portion of the gate oxide layer by the active area.

8. The semiconductor arrangement of claim 1, the active area comprising:
an undoped polysilicon layer; and
a doped polysilicon layer comprising the at least one of a p-type region or an n-type region, wherein the doped polysilicon layer is in contact with a top surface of the undoped polysilicon layer, a sidewall of the undoped polysilicon layer, and the top surface of the substrate.

9. The semiconductor arrangement of claim 1, the first portion of the bottom surface of the active area having a first length and a top surface of the active area having a second length, the second length greater than the first length.

10. The semiconductor arrangement of claim 8, comprising:
a gate oxide layer in contact with the top surface of the substrate and in contact with a bottom surface of the undoped polysilicon layer, wherein the doped polysilicon layer is in contact with a sidewall of the gate oxide layer.

11. A method of forming a semiconductor arrangement comprising:
forming an opening over a top surface of a substrate comprising a well, such that the opening is defined between a first portion of a gate oxide layer and a second portion of a gate oxide layer;
forming an active area on the substrate comprising:
forming a first layer over the gate oxide layer;
forming the opening through the first layer;
forming a second layer over the first layer; and
implanting a first dopant into at least a first portion of the second layer to form a first implanted area, wherein the active area is defined by:
a first portion of the first layer having a bottom surface in contact with the first portion of the gate oxide layer;
a second portion of the first layer having a bottom surface in contact with the second portion of the gate oxide layer; and
a first portion of the first implanted area having a bottom surface in contact with the top surface of the substrate;
forming a sidewall spacer adjacent the active area, the sidewall spacer in contact with a top surface of the gate oxide layer; and
forming a contact connecting the active area to a voltage supply.

12. The method of claim 11, comprising forming a gate adjacent the active area on the top surface of the gate oxide layer, the gate comprising a portion of the first layer.

13. The method of claim 11, comprising forming a gate adjacent the active area on the top surface of the gate oxide layer, the gate comprising a third portion of the first layer and a second portion of the second layer absent the first dopant.

14. The method of claim 11, comprising forming a gate adjacent the active area on the top surface of the gate oxide layer, the gate comprising a third portion of the first layer and a second portion of the first implanted area.

* * * * *